US006974730B2

(12) United States Patent
Diaz et al.

(10) Patent No.: US 6,974,730 B2
(45) Date of Patent: Dec. 13, 2005

(54) METHOD FOR FABRICATING A RECESSED CHANNEL FIELD EFFECT TRANSISTOR (FET) DEVICE

(75) Inventors: Carlos H. Diaz, Mountain View, CA (US); Yi-Ming Sheu, Hsinchu (TW); Syun-Ming Jang, Hsin-Chu (TW); Hun-Jan Tao, Hsinchu (TW); Fu-Liang Yang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 32 days.

(21) Appl. No.: 10/739,476

(22) Filed: Dec. 17, 2003

(65) Prior Publication Data

US 2005/0133830 A1 Jun. 23, 2005

(51) Int. Cl.[7] ............................................. H01L 21/336
(52) U.S. Cl. ...................... 438/163; 438/300; 438/307; 438/589
(58) Field of Search ......................................... 438/163

(56) References Cited

U.S. PATENT DOCUMENTS

| 5,814,544 | A |   | 9/1998  | Huang |
|-----------|---|---|---------|-------|
| 5,985,726 | A | * | 11/1999 | Yu et al. ..................... 438/301 |
| 6,225,173 | B1 |  | 5/2001  | Yu |
| 6,287,926 | B1 | * | 9/2001  | Hu et al. ..................... 438/306 |
| 6,475,888 | B1 | * | 11/2002 | Sohn ........................... 438/535 |
| 6,534,352 | B1 | * | 3/2003  | Kim ............................ 438/197 |
| 2003/0052333 | A1 | * | 3/2003 | Mistry ........................ 257/192 |

FOREIGN PATENT DOCUMENTS

JP            014123439 A  *  4/1992  ......... H01L 21/336

* cited by examiner

*Primary Examiner*—Stephen W. Smoot
(74) *Attorney, Agent, or Firm*—Thomas, Kayden, Horstemeyer & Risley

(57) ABSTRACT

A method for forming a field effect transistor device employs a self-aligned etching of a semiconductor substrate to form a recessed channel region in conjunction with a pair of raised source/drain regions. The method also provides for forming and thermally annealing the pair of source/drain regions prior to forming a pair of lightly doped extension regions within the field effect transistor device. In accord with the foregoing features, the field effect transistor device is fabricated with enhanced performance.

13 Claims, 3 Drawing Sheets

METHOD FOR FABRICATING A RECESSED CHANNEL FIELD EFFECT TRANSISTOR (FET) DEVICE

BACKGROUND OF THE INVENTION

1. Field of the Invention

The present invention relates generally to methods for fabricating field effect transistor devices. More particularly, the present invention relates to methods for fabricating field effect transistor devices with enhanced performance.

2. Description of the Related Art

Common in the semiconductor product art is the fabrication and use of field effect transistor devices. Field effect transistor devices are readily fabricated and scaled with either or both polarities. They are typically employed as switching devices within both logic semiconductor products and memory semiconductor products.

Field effect transistor devices are thus common and generally essential in the semiconductor product art. However, they are nonetheless not entirely without problems.

In that regard, as semiconductor product integration levels have increased and field effect transistor device dimensions have decreased, it has become increasingly difficult to fabricate field effect transistor devices with enhanced performance. Performance within advanced field effect transistor devices of reduced dimensions may be compromised by effects such as short channel effects and source-drain resistance effects.

It is thus desirable to fabricate field effect transistor devices with enhanced performance. It is towards the foregoing object that the present invention is directed.

Various field effect transistor devices having desirable properties, and methods for fabrication thereof, have been disclosed within the semiconductor product art.

Included but not limiting among the field effect transistor devices and methods are those disclosed within: (1) Huang, in U.S. Pat. No. 5,814,544 (a field effect transistor device with a recessed channel region formed employing a thermal oxidation method); and (2) Yu, in U.S. Pat. No. 6,225,173 (a field effect transistor device with a recessed channel formed employing a planarizing method).

The teachings of each of the foregoing references are incorporated herein fully by reference.

Additional methods for forming field effect transistor devices with enhanced performance are desirable.

It is towards the foregoing object that the present invention is directed.

SUMMARY OF THE INVENTION

A first object of the invention is to provide a method for forming a field effect transistor device.

A second object of the invention is to provide a method in accord with the first object of the invention, wherein the field effect transistor device is formed with enhanced performance.

In accord with the objects of the invention, the invention provides a method for forming a recessed channel field effect transistor device.

The method first provides a semiconductor substrate. A first sacrificial layer is formed upon the semiconductor substrate and a pair of source/drain regions is implanted into the semiconductor substrate while employing the first sacrificial layer as a mask. A pair of second sacrificial layers is formed overlying the pair of source/drain regions and adjoining the first sacrificial layer. The first sacrificial layer is then removed to form an aperture which exposes the semiconductor substrate. The semiconductor substrate exposed within the aperture is etched to form an elongated aperture. A pair of sacrificial sidewall spacer layers is formed upon the sidewalls of the elongated aperture and a gate dielectric layer is formed at the bottom of the elongated aperture. A gate electrode is then formed filling the remainder of the elongated aperture. The pair of second sacrificial layers and the pair of sacrificial sidewall spacer layers is then removed. Finally, a pair of lightly doped extension regions is then implanted into the semiconductor substrate while employing the gate electrode as a mask.

The invention provides a method for forming a field effect transistor device with enhanced performance.

The invention realizes the foregoing object by forming the field effect transistor device with a recessed channel region and with lightly doped extension regions formed after source/drain regions.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a field effect transistor device with enhanced performance.

The invention realizes the foregoing object by forming the field effect transistor device with a recessed channel region and with lightly doped extension regions formed after source/drain regions.

The preferred embodiment of the invention illustrates the invention within the context of forming a field effect transistor device within a silicon-on-insulator semiconductor substrate. However, the present invention is not intended to be so limited. Rather, the invention may be employed for forming field effect transistor devices within semiconductor substrates including but not limited to silicon semiconductor substrates and silicon-germanium alloy semiconductor substrates, whether bulk semiconductor substrates or silicon (or silicon-germanium) on-insulator semiconductor substrates. In addition, the present invention may be employed for forming field effect transistor devices of either or both polarities within a semiconductor substrate.

FIG. 1 to FIG. 11 show a series of schematic cross-sectional diagrams illustrating the results of progressive stages in forming a field effect transistor device in accord with a preferred embodiment of the invention.

Figure 1:
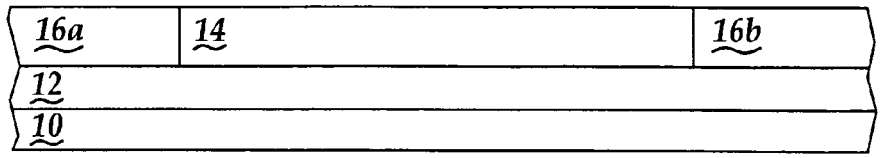
FIG. 1, FIG. 2, FIG. 3, FIG. 4, FIG. 5, FIG. 6, FIG. 7, FIG. 8, FIG. 9, FIG. 10 and FIG. 11 show a series of schematic cross-sectional diagrams illustrating the results of progressive stages in forming a field effect transistor device in accord with a preferred embodiment of the invention.

FIG. 1 illustrates a silicon-on-insulator semiconductor substrate prior to forming thereupon the field effect transistor device.

Within FIG. 1, the silicon-on-insulator semiconductor substrate comprises a semiconductor substrate 10 having formed thereupon a buried oxide layer 12. In turn, formed upon the buried oxide layer 12 is a pair of isolation regions 16a and 16b which bound an active silicon layer 14 which is also formed upon the buried oxide layer 12.

As noted above, the invention is not limited to a silicon-on-insulator semiconductor substrate as illustrated in FIG. 1. Alternatively, the invention may employ a bulk silicon or silicon-germanium alloy substrate, a silicon-germanium on-insulator substrate or an otherwise laminated semiconductor substrate which provides a surface layer formed of a semiconductor material upon which may be formed a field effect transistor in accord with the invention.

Within FIG. 1, the buried oxide layer 12 is typically a silicon oxide layer formed to a thickness of from about 1500 to about 4000 angstroms. In addition, the active silicon layer 14 is formed to a thickness of from about 1 to about 2 microns and a linewidth of from about 0.3 to about 1 micron. Finally, the pair of isolation regions 16a and 16b is typically formed of a silicon oxide material.

Figure 2:
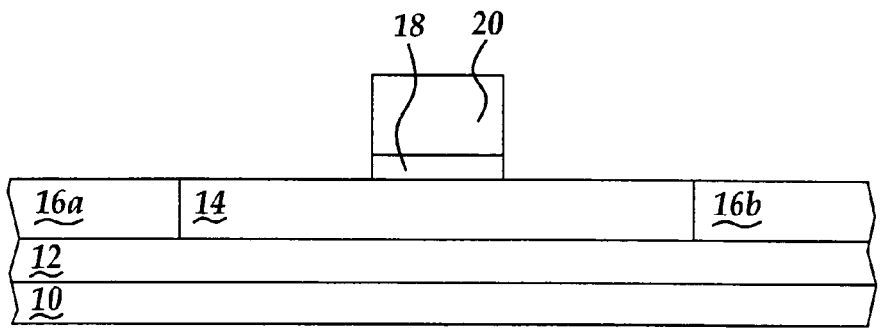

FIG. 2 illustrates the results of further processing of the silicon-on-insulator semiconductor substrate of FIG. 1.

FIG. 2 illustrates a pad dielectric layer 18 formed nominally centered upon the active silicon layer 14 and a dummy gate 20 formed aligned upon the pad dielectric layer 18. Together, the pad dielectric layer 18 and the dummy gate 20 form a first sacrificial layer.

Within the invention, the pad dielectric layer 18 is optional, but generally formed of a silicon oxynitride dielectric material formed to a thickness of from about 100 to about 300 angstroms. In addition, the dummy gate 20 is typically formed of a silicon oxide material, although other materials, which need not necessarily be dielectric materials, may also be employed. Typically, the dummy gate 20 is formed to a thickness of from about 4000 to about 6000 angstroms. Each of the pad dielectric layer 18 and the dummy gate 20 is formed to a linewidth of from about 0.1 to about 0.3 microns.

Figure 3:
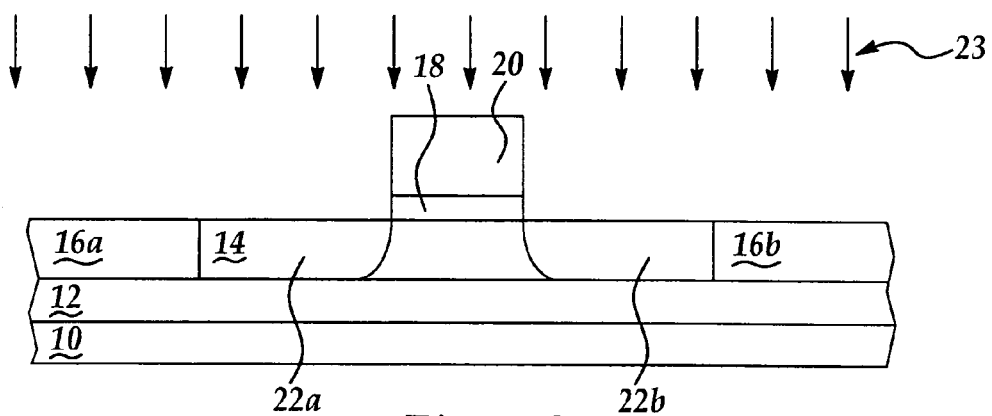

FIG. 3 illustrates the results of further processing of the silicon-on-insulator semiconductor substrate of FIG. 2.

FIG. 3 illustrates the results implanting a dose of first implanting dopant ions 23 into the active silicon layer 14 while employing the pad dielectric layer 18 and the dummy gate 20 as a mask. The ion implantation forms a pair of source/drain regions 22a and 22b which include a thickness of the active silicon layer 14.

Within the invention, the dose of first implanting dopant ions 23 may be of either polarity as is appropriate for forming the pair of source/drain regions 22a and 22b, and of a dosage and energy as is otherwise conventional for forming the pair of source/drain regions 22a and 22b. Typically, the pair of source/drain regions 22a and 22b is formed with a dopant concentration of from about 1E15 to about 1E18 dopant atoms per cubic centimeter. In addition, the pair of source/drain regions 22a and 22b is typically thermally annealed at a temperature of from about 900 to about 1100 degrees centigrade for a time period of from about 1 to about 2 hours such as to repair ion implant damage within the active silicon layer 14.

Figure 4:
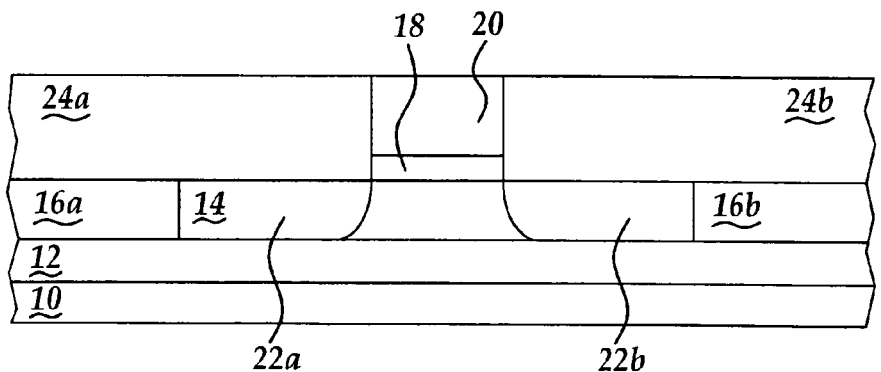

FIG. 4 illustrates the results of further processing of the silicon-on-insulator semiconductor substrate of FIG. 3.

FIG. 4 illustrates a pair of patterned planarized second sacrificial layers 24a and 24b formed adjoining a pair of opposite sidewalls of the dummy gate 20 and the pad dielectric layer 18.

The pair of patterned planarized second sacrificial layers 24a and 24b is typically formed of a silicon nitride material when the dummy gate 20 is formed of a silicon oxide material and the pad dielectric layer 18 is formed of a silicon oxynitride material. Other materials combinations may, however, be employed providing adequate etch selectivity of the dummy gate 20 and the pad dielectric layer 18 with respect to the pair of patterned planarized sacrificial layers 24a and 24b. Typically, the pair of patterned planarized second sacrificial layers 24a and 24b is formed incident to planarizing a blanket layer while employing a planarizing method such as a reactive ion etch (RIE) etchback planarizing method or (more preferably) a chemical mechanical polish (CMP) planarizing method. Either of the foregoing planarizing methods may employ the dummy gate 20 as a planarizing stop layer.

Figure 5:
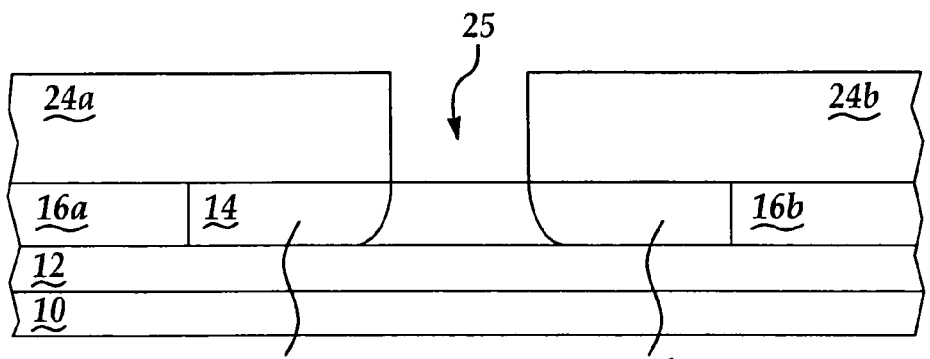

FIG. 5 illustrates the results of further processing of the silicon-on-insulator semiconductor substrate of FIG. 4.

FIG. 5 illustrates the results of stripping the dummy gate 20 and the pad dielectric layer 18 from interposed between the pair of patterned planarized second sacrificial layers 24a and 24b to form an aperture 25 exposing at its bottom a portion of the active silicon layer 14.

The dummy gate 20 and the pad dielectric layer 18 may be stripped selectively with respect to the pair of patterned planarized second sacrificial layers 24a and 24b while employing stripping methods and materials as are otherwise generally conventional in the semiconductor product fabrication art. Typically, such stripping methods and materials may employ, but are not limited to, hydrofluoric acid containing stripping methods and materials when the dummy gate 20 is formed of a silicon oxide material, the optional pad dielectric layer 18 is formed of a silicon oxynitride material and the pair of patterned planarized second sacrificial layers 24a and 24b is formed of a silicon nitride material.

Figure 6:
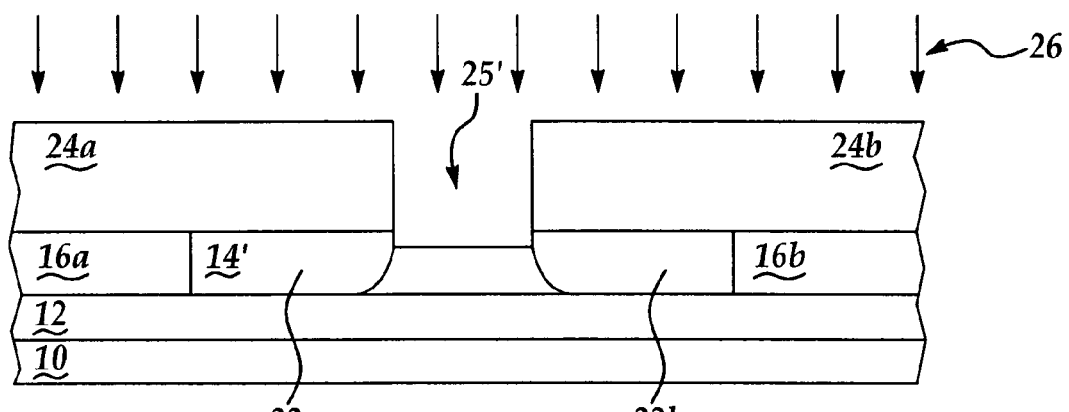

FIG. 6 illustrates the results of further processing of the silicon-on-insulator semiconductor substrate of FIG. 5.

FIG. 6 illustrates the results of etching the active silicon layer 14 exposed at the bottom of the aperture 25 defined by the pair of patterned planarized second sacrificial layers 24a and 24b with an etching plasma 26, to form an etched active silicon layer 14' exposed at the bottom of an elongated aperture 25'.

The etching plasma 26 will typically employ an etchant gas composition appropriate to the silicon material from which is formed the active silicon layer 14. Such an etchant gas composition will typically comprise a chlorine containing etchant gas. Typically, the active silicon layer 14 is etched to a depth of from about 500 to about 2000 angstroms when forming the etched active silicon layer 14'. The exposed surface of the etched active silicon layer 14' may also be reoxidized to form a sacrificial oxide layer of from about 10 to about 50 angstroms thereupon, and thus provide enhanced surface conditioning of the etched active silicon layer 14'. As is understood by a person skilled in the art, the etch depth when forming the etched active silicon layer 14' may be adjusted to provide an optimal thickness of a channel region of a field effect transistor device formed incident to further processing the silicon-on-insulator semiconductor substrate whose schematic cross-sectional diagram is illustrated in FIG. 6. Such an optimal thickness may be employed to control field effect transistor device parameters, such as threshold voltage. In addition, the etch depth provides a recessed channel region within the field effect transistor device, in conjunction with a pair of raised source/drain regions 22a and 22b within the field effect transistor device.

Figure 7:
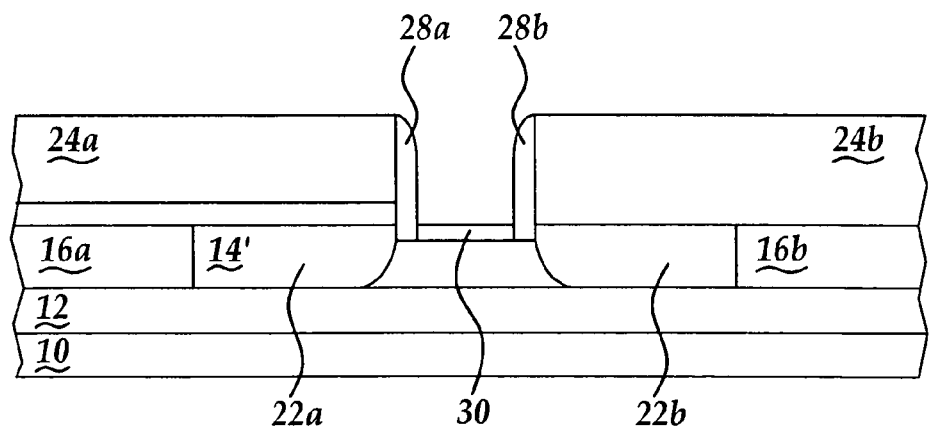

FIG. 7 shows the results of further processing of the silicon-on-insulator semiconductor substrate of FIG. 6.

FIG. 7 first shows a pair of sacrificial sidewall spacer layers 28a and 28b formed into the elongated aperture 25' and adjoining a pair of sidewalls of the pair of patterned planarized second sacrificial layers 24*a* and 24*b*. The pair of sacrificial sidewall spacer layers 28*a* and 28*b* may be formed employing a blanket conformal layer deposition and anisotropic etching method as is conventional in the semiconductor product fabrication art. Typically, the pair of sacrificial sidewall spacer layers 24*a* and 24*b* is formed of a silicon oxide material.

FIG. 7 also shows a gate dielectric layer 30 formed upon the etched active silicon layer 14' exposed at the base of the elongated aperture 25'. The gate dielectric layer 30 is typically formed of a silicon oxide dielectric material formed incident to thermal oxidation of the etched active silicon layer 14'. Typically, the gate dielectric layer 30 is formed to a thickness of from about 10 to about 70 angstroms.

Figure 8:
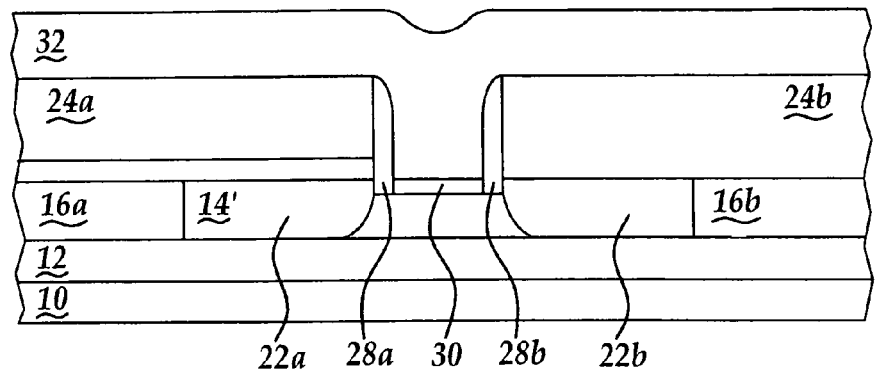

FIG. 8 illustrates the results of further processing of the silicon-on-insulator semiconductor substrate of FIG. 7.

FIG. 8 illustrates a blanket gate electrode material layer 32 formed upon exposed portions of the pair of patterned planarized second sacrificial layers 24*a* and 24*b*, the pair of sacrificial sidewall spacer layers 28*a* and 28*b* and the gate dielectric layer 30, while completely filling the elongated aperture 25'.

The blanket gate electrode material layer 32 is typically formed of a doped polysilicon material (having a dopant concentration of from about 1E19 to about 1E22 dopant atoms per cubic centimeter) formed to an appropriate thickness such as to completely fill the elongated aperture 25'.

Figure 9:
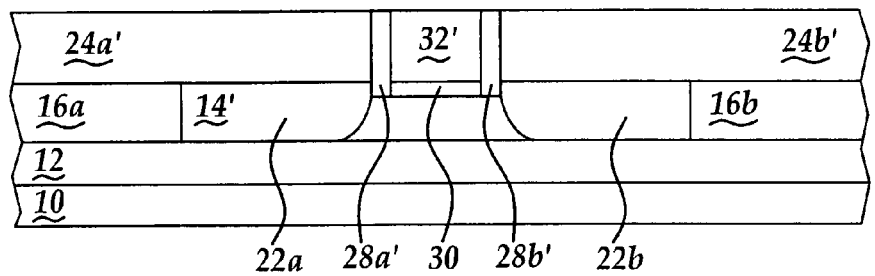

FIG. 9 illustrates the results of further processing of the silicon-on-insulator semiconductor substrate of FIG. 8.

FIG. 9 illustrates the results of planarizing the pair of patterned planarized second sacrificial layers 24*a* and 24*b*, the pair of sacrificial sidewall spacer layers 28*a* and 28*b* and the blanket gate electrode material layer 32 to form a pair of patterned twice planarized second sacrificial layers 24*a*' and 24*b*', a pair of truncated sacrificial sidewall spacer layers 28*a*' and 28*b*' and a gate electrode 32'.

The foregoing planarizing is typically effected while employing a chemical mechanical polish planarizing method.

Figure 10:
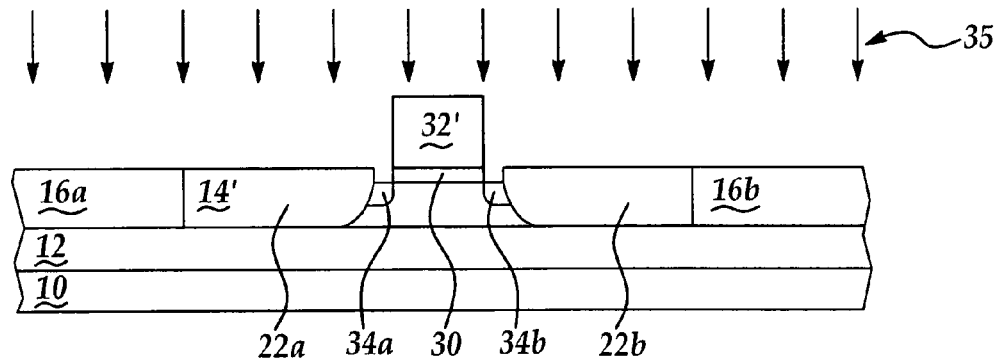

FIG. 10 illustrates the results of further processing of the silicon-on-insulator semiconductor substrate of FIG. 9.

In a first instance, FIG. 10 illustrates the results of stripping the pair of patterned twice planarized second sacrificial layers 24*a*' and 24*b*' and the pair of truncated sacrificial sidewall spacer layers 28*a*' and 28*b*' from adjacent or adjoining the gate electrode 32'.

The pair of twice planarized second sacrificial spacer layers 24*a*' and 24*b*' when formed of a silicon nitride material may typically be stripped while employing a phosphoric acid etchant solution at elevated temperature. In addition, the pair of truncated sacrificial sidewall spacer layers 28*a*' and 28*b*' when formed of a silicon oxide material may be stripped while employing a hydrofluoric acid etchant solution.

Finally, FIG. 10 also illustrates a pair of lightly doped extension regions 34*a* and 34*b* formed within the recess within the etched active silicon layer 14', and bridging to the pair of source/drain regions 22*a* and 22*b*. The pair of lightly doped extension regions 34*a* and 34*b* is formed while employing a dose of second implanting dopant ions 35 in conjunction with the gate electrode 32' as a mask.

The dose of second implanting dopant ions 35 is of the same polarity as the dose of first implanting dopant ions 23, but provided at a considerably lower dose of and energy such as to provide the pair of lightly doped extensions regions 34*a* and 34*b* of dopant concentration from about 1E12 to about 1E14 dopant atoms per cubic centimeter.

Figure 11:
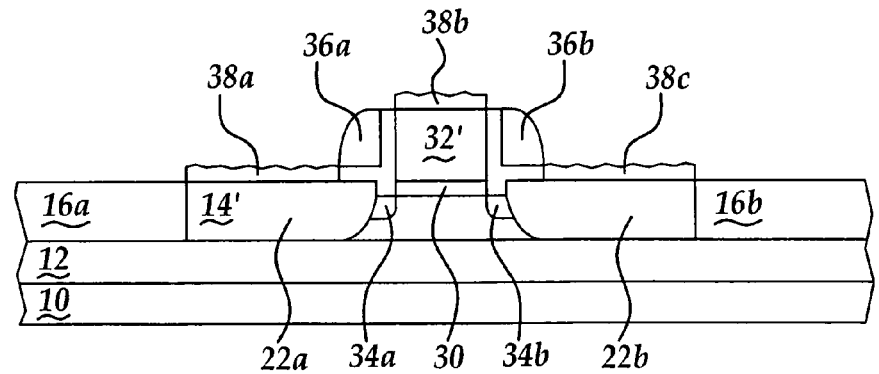

FIG. 11 illustrates the results of further processing of the silicon-on-insulator semiconductor substrate of FIG. 10.

FIG. 11 illustrates a pair of laminated spacer layers 36*a* and 36*b* formed adjoining a pair of sidewalls of the gate electrode 32'.

The pair of laminated spacer layers 36*a* and 36*b* is typically formed of a silicon nitride material laminated to a silicon oxide material as a lower layer.

FIG. 11 also shows a series of metal silicide layers 38*a*, 38*b* and 38*c* formed upon the pair of source/drain regions 22*a* and 22*b* and the gate electrode 32'.

The series of metal silicide layers 38*a*, 38*b* and 38*c* may be formed from any of several metals as are conventional in the semiconductor fabrication art, including but not limited to titanium, tungsten, platinum, vanadium and molybdenum metals. Typically, the series of metal silicide layers 38*a*, 38*b* and 38*c* is each formed to a thickness of from about 200 to about 1000 angstroms, while employing a salicide method.

FIG. 11 illustrates a field effect transistor device formed within a silicon-on-insulator semiconductor substrate. The field effect transistor device is formed with enhanced performance.

The field effect transistor device realizes the foregoing object by fabricating the field effect transistor device with a recessed channel region, and with a pair of lightly doped drain extension regions formed after a pair of source/drain regions.

Within the field effect transistor device of the present invention, the recessed channel region is formed in a self-aligned fashion with respect to the pair of source/drain regions such as to provide reduced source/drain resistance within the field effect transistor device. The self-aligned method also provides for forming a gate electrode of less than minimal photolithographically resolvable linewidth and for forming a gate electrode after source/drain region formation thus avoiding ion implant damage to the gate electrode. In addition, the pair of raised source/drain regions (and the resultant pair of embedded laminated spacers as 36*a* and 36*b* as illustrated in FIG. 11) provide for inhibited metal silicide layer incursion and bridging. Further, by providing a method wherein the pair of source/drain regions 22*a* and 22*b* is formed and thermally annealed prior to forming the pair of lightly doped extension regions 34*a* and 34*b*, short channel effect performance is generally improved.

The preferred embodiment of the invention is illustrative of the invention rather than limiting of the invention. Revisions and modifications may be made to methods, materials, structures and dimensions in accord with the preferred embodiment of the invention while still providing a method for forming a field effect transistor device in accord with the invention, further in accord with the accompanying claims.

What is claimed is:

1. A method for forming a recessed channel field effect transistor device comprising:

providing a semiconductor substrate;

forming a first sacrificial layer upon the semiconductor substrate;

forming a pair of source/drain regions in the semiconductor substrate while employing the first sacrificial layer as a mask;

forming a pair of second sacrificial layers overlying the pair of source/drain regions and adjoining the first sacrificial layer;

removing the first sacrificial layer to form an aperture which exposes the semiconductor substrate;

etching the semiconductor substrate exposed within the aperture to form an elongated aperture;

forming adjoining a pair of sidewalls of the elongated aperture a pair of sacrificial sidewall spacer layers, forming at the bottom of the elongated aperture a gate dielectric layer and forming filling the remainder of the elongated aperture a gate electrode;

removing the pair of second sacrificial layers and the pair of sacrificial sidewall spacer layers; and implanting a pair of lightly doped extension regions into the semiconductor substrate while employing the gate electrode as a mask.

2. The method of claim 1 wherein the semiconductor substrate is selected from the group consisting of bulk silicon semiconductor substrates and silicon-on-insulator semiconductor substrates.

3. The method of claim 1 wherein the first sacrificial layer is formed of an oxide material.

4. The method of claim 1 wherein the pair of second sacrificial layers is formed of a silicon nitride material.

5. The method of claim 1 wherein the pair of sacrificial sidewall spacer layers is formed of a silicon oxide material.

6. The method of claim 1 wherein the semiconductor substrate is etched to a depth of from about 500 to about 2000 angstroms.

7. The method of claim 1 wherein the pair of source/drain regions is thermally annealed prior to forming the pair of lightly doped extension regions.

8. A method for forming a recessed channel field effect transistor device comprising:

providing a silicon-on-insulator semiconductor substrate;

forming a first sacrificial layer upon the silicon-on-insulator semiconductor substrate;

implanting a pair of source/drain regions into an active silicon layer within the silicon-on-insulator semiconductor substrate while employing the first sacrificial layer as a mask;

forming a pair of second sacrificial layers overlying the pair of source/drain regions and adjoining the first sacrificial layer;

removing the first sacrificial layer to form an aperture which exposes the active silicon layer;

etching the active silicon layer exposed within the aperture to form an elongated aperture;

forming adjoining a pair of sidewalls of the elongated aperture a pair of sacrificial sidewall spacer layers, forming at the bottom of the elongated aperture a gate dielectric layer and forming filling the remainder of the elongated aperture a gate electrode;

removing the pair of second sacrificial layers and the pair of sacrificial sidewall spacer layers; and implanting a pair of lightly doped extension regions into the semiconductor substrate while employing the gate electrode as a mask.

9. The method of claim 8 wherein the first sacrificial layer is formed of an oxide material.

10. The method of claim 8 wherein the pair of second sacrificial layers is formed of a silicon nitride material.

11. The method of claim 8 wherein the pair of sacrificial sidewall spacer layers is formed of a silicon oxide material.

12. The method of claim 8 wherein the active silicon layer is etched to a depth of from about 500 to about 2000 angstroms.

13. The method of claim 8 wherein the pair of source/drain regions is thermally annealed prior to forming the pair of lightly doped extension regions.

* * * * *